(12) United States Patent
Jia et al.

(10) Patent No.: US 12,538,576 B2
(45) Date of Patent: Jan. 27, 2026

(54) SUBSTRATE HAVING INSULATING LAYER WITH HIGH-ASPECT-RATIO GROOVE, METHOD FOR MANUFACTURING SUBSTRATE, DISPLAY DEVICE AND ELECTRONIC APPARATUS

(71) Applicants: BEIJING BOE TECHNOLOGY DEVELOPMENT CO., LTD., Beijing (CN); BOE TECHNOLOGY GROUP CO., LTD., Beijing (CN)

(72) Inventors: Mengwen Jia, Beijing (CN); Jian Zhou, Beijing (CN); Yafei Zhang, Beijing (CN); Feng Qu, Beijing (CN); Biqi Li, Beijing (CN)

(73) Assignees: Beijing BOE Technology Development Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 407 days.

(21) Appl. No.: 18/022,302

(22) PCT Filed: Mar. 29, 2022

(86) PCT No.: PCT/CN2022/083670
§ 371 (c)(1),
(2) Date: Feb. 21, 2023

(87) PCT Pub. No.: WO2023/184149
PCT Pub. Date: Oct. 5, 2023

(65) Prior Publication Data
US 2024/0282777 A1 Aug. 22, 2024

(51) Int. Cl.
*H10D 86/60* (2025.01)
*H10D 86/01* (2025.01)
*H10D 86/40* (2025.01)

(52) U.S. Cl.
CPC ......... *H10D 86/60* (2025.01); *H10D 86/0212* (2025.01); *H10D 86/441* (2025.01)

(58) Field of Classification Search
CPC ... H10D 86/60; H10D 86/0212; H10D 86/441
(Continued)

(56) References Cited

U.S. PATENT DOCUMENTS 6,819,124 B1 * 11/2004 Allee ................. G01R 31/2858
324/754.09
9,179,538 B2 * 11/2015 Foster .................. H05K 9/0024
(Continued)

FOREIGN PATENT DOCUMENTS

| CN | 105451455 A | 3/2016 |
|---|---|---|
| CN | 109768027 A | 5/2019 |
| CN | 111982392 A | 11/2020 |

*Primary Examiner* — Jami Valentine Miller
(74) *Attorney, Agent, or Firm* — WHDA, LLP

(57) ABSTRACT

A substrate, a method for manufacturing the substrate, a display device, and an electronic apparatus are provided. The substrate includes: a base; an insulating layer on the base, and a metal trace, wherein a groove is arranged in a side surface of the insulating layer distal to the base, the depth of the groove is greater than 2 μm, a ratio of the depth to the width of the groove is greater than 1, and the width is the dimension of a longitudinal section of the groove in a first direction, the first direction is parallel to the base; the depth is a dimension of a longitudinal section of the groove in a second direction, the second direction is perpendicular to the base; the metal trace is within the groove, and a thickness of the metal trace is equal to or substantially equal to the depth of the groove.

17 Claims, 7 Drawing Sheets

(58) Field of Classification Search
USPC .......................................................... 257/59
See application file for complete search history.

(56) References Cited

U.S. PATENT DOCUMENTS

| | | | |
|---|---|---|---|
| 2005/0099190 A1* | 5/2005 | Li | G01N 21/55 |
| | | | 324/762.05 |
| 2006/0232768 A1 | 10/2006 | Borden et al. | |
| 2009/0098727 A1 | 4/2009 | Hong et al. | |
| 2012/0048599 A1* | 3/2012 | Lin | H05K 1/0253 |
| | | | 174/255 |
| 2019/0033365 A1* | 1/2019 | Sanchez | H01L 22/34 |
| 2022/0100304 A1* | 3/2022 | Yu | H10K 59/124 |
| 2022/0310670 A1* | 9/2022 | Ren | H10D 86/40 |
| 2024/0070366 A1* | 2/2024 | Haehn | G06F 30/398 |

\* cited by examiner

SUBSTRATE HAVING INSULATING LAYER WITH HIGH-ASPECT-RATIO GROOVE, METHOD FOR MANUFACTURING SUBSTRATE, DISPLAY DEVICE AND ELECTRONIC APPARATUS

CROSS-REFERENCE TO RELATED APPLICATION

The present application is the U.S. national phase of PCT Application No. PCT/CN2022/083670 filed on Mar. 29, 2022, which is incorporated herein by reference in its entirety.

TECHNICAL FIELD

The present disclosure relates to the technical field of semiconductors, and in particular, to a substrate and a method for manufacturing the substrate, a display device, and an electronic apparatus.

BACKGROUND

In the field of electronic apparatuses, transparent conductive films have been widely used, and metal mesh transparent conductive films have the advantages of low resistance, fast response and good flexibility, which have become one of the most competitive transparent conductive films.

The metal mesh material itself is opaque; thus, in order to obtain a better transmittance, it is necessary to reduce a line width of the metal mesh, for example, the line width of the metal mesh should be less than 2 μm. In addition, in order to satisfy the resistivity requirement, it is necessary to increase the thickness of the metal mesh, for example, the thickness of the metal mesh is required to be 2 μm or more. However, in the prior art, it is difficult to satisfy both the thickness of the metal mesh being greater than 2 μm and the line width of the metal mesh being less than 2 μm through the known manufacturing process.

SUMMARY

The technical problem to be solved by the present disclosure is to provide a substrate, a method for manufacturing the substrate, a display device, and an electronic apparatus, which can improve the transmittance of the substrate.

In order to solve the above technical problem, the embodiments of the present disclosure provide the following technical solutions.

In one aspect, the present disclosure provides a substrate, including:
a base;
an insulating layer arranged on the base, wherein a groove is arranged in a side surface of the insulating layer distal to the base, a depth of the groove is greater than 2 μm, a ratio of the depth to a width of the groove is greater than 1, the width is a dimension of a longitudinal section of the groove in a first direction, the first direction is parallel to the base; the depth is a dimension of a longitudinal section of the groove in a second direction, and the second direction is perpendicular to the base;
a metal trace arranged within the groove, wherein a thickness of the metal trace is equal to or substantially equal to the depth of the groove.

In some embodiments, the insulating layer includes:
a first insulating sub-layer, wherein a first groove is arranged in a side surface of the first insulating sub-layer distal to the base;
a second insulating sub-layer arranged on a side of the first insulating sub-layer distal to the base, wherein the second insulating sub-layer covers the first groove, the groove is formed at a position corresponding to the first groove, an orthographic projection of the groove onto the base is located within an orthographic projection of the first groove onto the base.

In some embodiments, the second insulating sub-layer includes:
a plurality of insulating film layers laminated in a direction away from the base.

In some embodiments, the second insulating sub-layer comprises at least one group of insulating film layers, wherein each of the at least one group of insulating film layers comprises a first insulating film layer and a second insulating film layer, the first insulating film layer is arranged between the second insulating film layer and the base, a refractive index of the first insulating film layer is less than a refractive index of the first insulating sub-layer, and a refractive index of the second insulating film layer is greater than a refractive index of the first insulating sub-layer.

In some embodiments, the second insulating sub-layer includes one or two groups of insulating film layers.

In some embodiments, a difference between a refractive index of the insulating film layer and a refractive index of the first insulating sub-layer is less than 0.01.

In some embodiments, a ratio of the refractive index of the insulating film layer to the refractive index of the first insulating sub-layer is greater than or equal to 0.98 and smaller than or equal to 1.02.

In some embodiments, the substrate further includes:
a planarization layer on a side of the metal trace distal to the base, a refractive index of the planarization layer being the same as a refractive index of the first insulating sub-layer.

An embodiment of the present disclosure further provides a method for manufacturing a substrate, including:
providing a base;
forming an insulating layer on the base, and forming a groove in a side surface of the insulating layer distal to the base, wherein a depth of the groove is greater than 2 μm, a ratio of the depth to a width of the groove is greater than 1, the width is a dimension of a longitudinal section of the groove in a first direction, the first direction is parallel to the base; the depth is a dimension of a longitudinal section of the groove in a second direction, and the second direction is perpendicular to the base;
forming a metal trace within the groove, wherein a thickness of the metal trace is equal to or substantially equal to the depth of the groove.

In some embodiments, forming the insulating layer includes:
forming a first insulating sub-layer on the base, wherein a first groove is formed in a side surface of the first insulating sub-layer distal to the base;
forming a second insulating sub-layer on a side of the first insulating sub-layer distal to the base, wherein the second insulating sub-layer covers the first groove, the groove is formed at a position corresponding to the first groove, an orthographic projection of the groove onto the base is located within an orthographic projection of the first groove onto the base.

In some embodiments, forming the second insulating sub-layer includes:
    forming a plurality of insulating film layers which are laminated.

In some embodiments, forming the second insulating sub-layer includes:
    forming at least one group of insulating film layers, wherein each of the at least one group of insulating film layers comprises a first insulating film layer and a second insulating film layer, the first insulating film layer is located between the second insulating film layer and the base, a refractive index of the first insulating film layer is less than a refractive index of the first insulating sub-layer, and a refractive index of the second insulating film layer is greater than a refractive index of the first insulating sub-layer.

In some embodiments, forming a metal trace within the groove includes:
    forming a metal layer on the insulating layer in which the groove is formed, patterning the metal layer to form a metal seed pattern located within the groove, and a thickness of the metal seed pattern is than the depth of the groove;
    depositing metal on the metal seed pattern through a metal plating process, to form the metal trace.

An embodiment of the present disclosure further provides a display device including the substrate as described above.

An embodiment of the present disclosure further provides an electronic apparatus including the substrate as described above.

The embodiments of present disclosure has the following beneficial effects:
    in the above-mentioned solution, a groove is arranged in the surface of a side of the insulating layer distal to the base, a metal trace is formed within the groove, the depth of the groove is greater than 2 μm, and a ratio of the depth to the width of the groove is greater than 1; therefore, the ratio of the thickness to the width of the metal trace is also greater than 1, and a metal trace with a thickness greater than 2 μm and a line width less than 2 μm can be formed; and the optical transparency of the metal mesh made by using the metal trace is high, and the transmittance of the substrate can be improved.

REFERENCE NUMERALS

Figure 1:
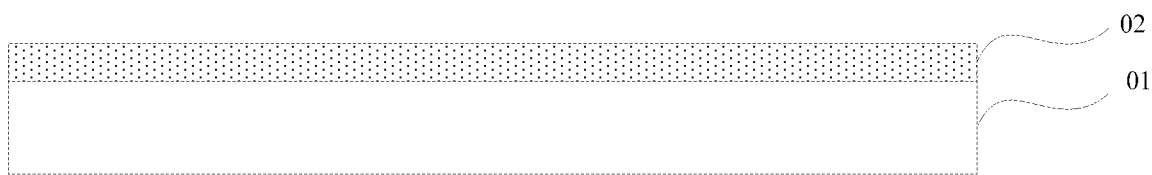
FIGS. 1 to 18 show schematic diagrams of a process for manufacturing a substrate in accordance with embodiments of the present disclosure.

01 Rigid base
02 Flexible base
03 Buffer layer
04 First insulating sub-layer
05 Mask layer
06 Photoresist
07 Second insulating sub-layer
08 Metal layer
081 Metal seed pattern
09 Metal trace
071, 073 First insulating film layer
072, 074 Second insulating film layer
11 First groove
12 Groove

DETAILED DESCRIPTION

In order that the technical problems, technical solutions, and advantages to be solved by the embodiments of the present disclosure becomes more apparent, a detailed description will be given below with reference to the accompanying drawings and specific embodiments.

Embodiments of the present disclosure provide a substrate, a method for manufacturing the substrate, a display device, and an electronic apparatus, which can improve the transmittance of the substrate.

An embodiment of the present disclosure provides a substrate, including:
    a base;
    an insulating layer on the base, wherein a groove is arranged in a side surface of the insulating layer distal to the base, the depth of the groove is greater than 2 μm, a ratio of the depth to the width of the groove is greater than 1, and the width is the dimension of a longitudinal section of the groove in a first direction, the first direction is parallel to the base; the depth is a dimension of a longitudinal section of the groove in a second direction, and the second direction is perpendicular to the base;
    a metal trace within the groove, wherein a thickness of the metal trace is equal to or substantially equal to the depth of the groove.

The longitudinal section of the groove is a section of the groove in a direction perpendicular to the base.

In this embodiment, a groove is arranged in the surface of a side of the insulating layer distal to the base, a metal trace is formed in the groove, the depth of the groove may be greater than 2 μm, and the width of the groove may be less than 2 μm, so that the metal trace with a thickness greater than 2 μm and a line width less than 2 μm may be formed in the groove, the metal trace can satisfy the resistivity requirement, and the metal mesh made by using the metal trace has a high optical transparency, and the transmittance of the substrate can be improved.

The base may be a rigid base or a flexible base, the rigid base may be, for example, a quartz base and a glass base; the flexible base may be made of COP (cyclic olefin polymer), PET (polyethylene terephthalate), PI (polyimide), etc.

In the related art, it is difficult to achieve a metal mesh with a line width of being less than 2 μm and a thickness of being greater than 2 μm at the same time, because when it is to form on an insulating layer a groove with a depth of being greater than 2 μm and a width of being less than 2 μm, and form a metal line in the groove, it is difficult to expose and develop the line width of being less than 2 μm due to the limitation of the ultraviolet lithography process; and the width of the formed groove will also be greater than 2 μm due to the side etching of the etching process; in addition, if a metal line having a thickness of being greater than 2 μm and a width of being less than 2 μm is directly formed on the base, the metal line is easily collapsed.

In this embodiment, in order to obtain a groove with a depth of being greater than 2 μm and a width of being less than 2 μm (so as to obtain a metal trace with a line width of being less than 2 μm and a thickness of being greater than 2 μm), an insulating material may be etched firstly to form an initial groove (i.e. the first groove) with a depth of being greater than 2 μm and a ratio of depth to width of being less than 1, and then an insulating film layer is deposited on the insulating material. The insulating film layer covers the whole surface of the insulating material, including covering the side wall and the bottom of the first groove, so that the part of the insulating film layer covering the side wall of the first groove can help to reduce the width of the groove; in addition, since the insulating film layer covers the entire first groove, it is possible to ensure that the depth of the finally formed groove is equal to or approximately equal to the depth of the first groove, and thus it is possible to adjust the ratio of depth to width of the groove by controlling the thickness of the insulating film layer, such that the ratio of the depth to the width of the groove is greater than 1 and the depth of the groove is greater than 2 µm.

In some embodiments, the insulating layer includes:
a first insulating sub-layer, wherein a first groove is arranged in a side surface of the first insulating sub-layer distal to the base;
a second insulating sub-layer on a side of the first insulating sub-layer distal to the base, wherein the second insulating sub-layer covers the first groove, the groove is formed at a position corresponding to the first groove, and an orthographic projection of the groove onto the base is located within an orthographic projection of the first groove onto the base.

The depth of the finally formed groove depends on the depth of the first groove, the thickness of the first insulating sub-layer is not less than the depth of the first groove, and the thickness of the second insulating sub-layer depends on the difference between the widths of the first groove and the finally formed groove. For example, the width of the first groove is D1, the width of the finally formed groove is D2, and D1−D2=x, then the thickness d of the second insulating sub-layer may be d=x/1.2.

In some embodiments, the width of the first groove is 4 µm, and a groove with a width of 1.6 µm needs to be obtained, then the thickness of the second insulating sub-layer may be (4 µm−1.6 µm)/1.2−2 µm; in this way, a second insulating sub-layer having a thickness of 2 µm is deposited on the first groove, resulting in a groove having a width of 1.6 µm. In another embodiment, the width of the first groove is 5 µm, and a groove with a width of 1.4 µm needs to be obtained, then the thickness of the second insulating sub-layer may be (5 µm−1.4 µm)/1.2=3 µm; in this way, a second insulating sub-layer having a thickness of 3 µm is deposited on the first groove, resulting in a groove having a width of 1.4 µm. In these embodiments, the requirements on the accuracy of the photolithography and etching processes can be reduced, the desired groove can be obtained, and thus a metal trace with a small line width and a large thickness can be obtained.

When the depth of the groove is more than 2 µm, the thickness of the first insulating sub-layer needs to be more than 2 µm, and the first insulating sub-layer can be made of an organic material, because when an inorganic insulating layer having a relatively large thickness is deposited on a base, a relatively large stress is generated, and the base is easily broken. When the first insulating sub-layer is made of the organic material, the first insulating sub-layer may be formed through a coating process. In some embodiments, the first insulating sub-layer may be made of the SOC (system-on-chip) adhesive.

In order to precisely control the width of the groove, the second insulating sub-layer may be formed by depositing an inorganic insulating material. In order to do not adversely affect the visual effect of the substrate, the refractive index of the second insulating sub-layer should be substantially equal to the refractive index of the first insulating sub-layer.

In some embodiments, the second insulating sub-layer includes:
a plurality of insulating film layers laminated in a direction away from the base.

When the second insulating sub-layer includes only one insulating film layer, the refractive index of the insulating film layer is difficult to be exactly equal to the refractive index of the first insulating sub-layer due to the limitation of the deposition process. If the refractive index of the insulating film layer is not equal to the refractive index of the first insulating sub-layer, the visual effect of the substrate will be adversely affected. Therefore, the second insulating sub-layer may include a plurality of insulating film layers, so that even if the refractive index of one insulating film layer is not equal to the refractive index of the first insulating sub-layer, the refractive indices of the insulating film layers may match each other by adjusting the refractive indices of the other insulating film layers, so that the adverse impact on the visual effect of the substrate can be reduced.

In some embodiments, the second insulating sub-layer includes at least one group of insulating film layers, wherein each group of insulating film layers includes a first insulating film layer and a second insulating film layer, the first insulating film layer is located between the second insulating film layer and the base, a refractive index of the first insulating film layer is less than a refractive index of the first insulating sub-layer, and a refractive index of the second insulating film layer is greater than a refractive index of the first insulating sub-layer. Thus, it is not required that the refractive index of the insulating film layer must be exactly equal to the refractive index of the first insulating sub-layer, so that the requirement for the deposition process can be reduced and the process window can be enlarged. Specifically, a difference between a refractive index of the insulating film layer and a refractive index of the first insulating sub-layer may be less than 0.01. Alternatively, in some embodiments, a ratio of the refractive index of the insulating film layer to the refractive index of the first insulating sub-layer may be greater than or equal to 0.98 and smaller than or equal to 1.02.

Figure 19:
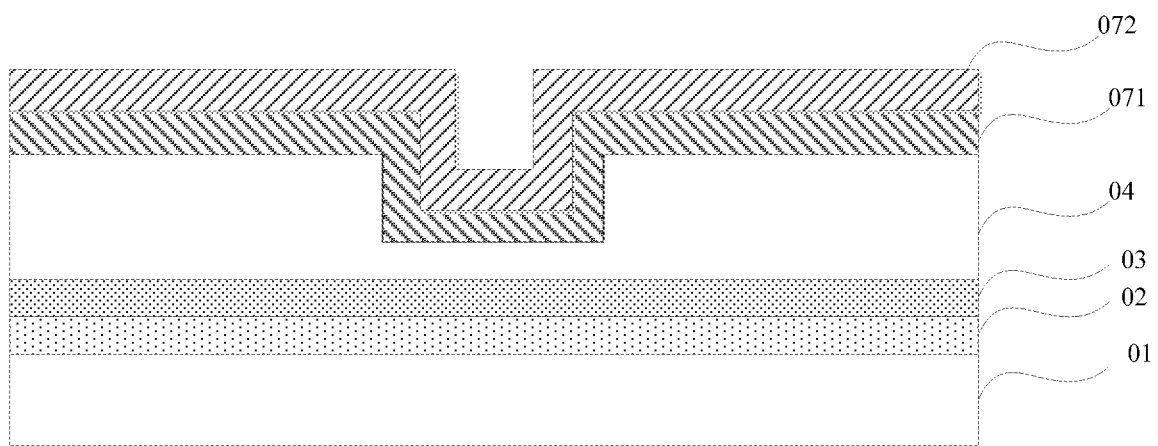
FIGS. 19-20 are structural diagrams of a second insulating sub-layer in accordance with embodiments of the present disclosure.

In some embodiments, the second insulating sub-layer includes one group of insulating film layers. As shown in FIG. 19, the substrate includes a rigid base 01, a flexible base 02 on the rigid base 01, a buffer layer 03 on the flexible base 02, a first insulating sub-layer 04 on the buffer layer 03, and a second insulating sub-layer on the first insulating sub-layer 04, wherein the second insulating sub-layer includes a first insulating film layer 071 and a second insulating film layer 072 which are laminated, wherein the flexible base 02 can be removed if the substrate is not required to be flexible.

In some embodiments, the second insulating sub-layer includes two groups of insulating film layers. As shown in FIG. 19, the substrate includes a rigid base 01, a flexible base 02 on the rigid base 01, a buffer layer 03 on the flexible base 02, a first insulating sub-layer 04 on the buffer layer 03, and a second insulating sub-layer on the first insulating sub-layer 04, wherein the second insulating sub-layer includes a first insulating film layer 071, a second insulating film layer 072, a third insulating film layer 073 and a fourth insulating film layer 074 which are laminated, wherein the flexible base 02 can be removed if the substrate is not required to be flexible.

It should be noted that, in this embodiment, the second insulating sub-layer is not limited to including one group of insulating film layers or two groups of insulating film layers, and may include three or more groups of insulating film layers.

In this embodiment, the refractive index of the first insulating film layer is less than the refractive index of the first insulating sub-layer, and the refractive index of the second insulating film layer is greater than the refractive index of the first insulating sub-layer; for example, when the first insulating sub-layer is made of SOC adhesive, the refractive index of the first insulating sub-layer is 1.53, the insulating film layer is made of SiON, the refractive index of the first insulating film layer may be 1.52-1.53, the refractive index of the second insulating film layer may be 1.53-1.55, and the thickness of the first insulating film layer may be equal to or different from that of the second insulating film layer. When light passes through the interface between the first insulating sub-layer and the first insulating film layer, the light will be deflected due to the refractive index difference between the first insulating sub-layer and the first insulating film layer; in addition, when light passes through the interface between the second insulating film layer and the first insulating film layer, the light will be deflected again due to the refractive index difference between the second insulating film layer and the first insulating film layer, and the path of the light is corrected, so that the propagation direction of the light is substantially the same as the propagation direction of the light in the first insulating sub-layer, and the adverse impact on the visual effect of the substrate can be reduced.

Figure 18:
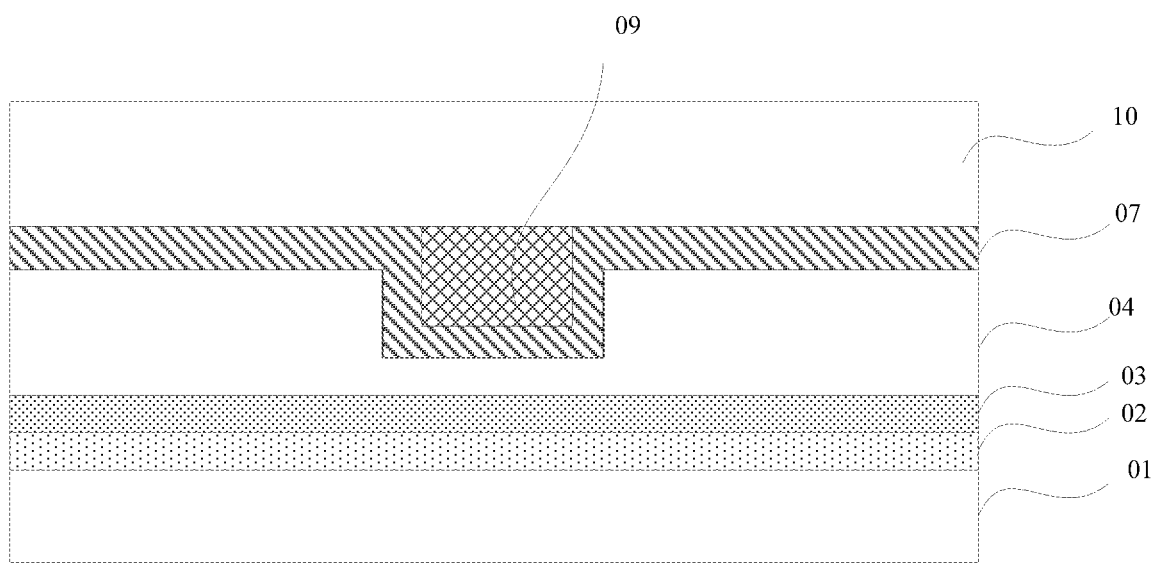

In some embodiments, in order to protect the metal trace, as shown in FIG. 18, the substrate further includes a planarization layer 10 on a side of the metal trace 09 distal to the base, and the planarization layer 10 prevent the metal trace from being oxidized. In order to improve the transparent visual effect of the substrate, the refractive index of the planarization layer is the same as the refractive index of the first insulating sub-layer. Specifically, a material of the planarization layer may be the same as that of the first insulating sub-layer. For example, the first insulating sub-layer is made of the SOC adhesive, and the planarization layer 10 may also be made of the SOC adhesive. In addition, the first insulating sub-layer and the planarization layer may also be made of NOA series ultraviolet curing adhesive or MR-1301 adhesive.

An embodiment of the present disclosure further provides a method for manufacturing a substrate, including:
  providing a base;
  forming an insulating layer on the base, and forming a groove in a side surface of the insulating layer distal to the base, wherein a depth of the groove is greater than 2 μm, a ratio of the depth to a width of the groove is greater than 1, the width is a dimension of a longitudinal section of the groove in a first direction, the first direction is parallel to the base; the depth is a dimension of a longitudinal section of the groove in a second direction, and the second direction is perpendicular to the base;
  forming a metal trace within the groove, wherein a thickness of the metal trace is equal to or substantially equal to the depth of the groove.

The longitudinal section of the groove is a section of the groove in a direction perpendicular to the base.

In this embodiment, a groove is arranged in the surface of a side of the insulating layer distal to the base, a metal trace is formed in the groove, the depth of the groove may be greater than 2 μm, and the width of the groove may be less than 2 μm, so that a metal trace with a thickness greater than 2 μm and a line width less than 2 μm may be formed in the groove, the metal trace can satisfy the resistivity requirement, and the metal mesh made of the metal trace has a high optical transparency, and the transmittance of the substrate can be improved.

The base may be a rigid base or a flexible base, the rigid base may be, for example, a quartz base or a glass base; the flexible base may be made of COP (cyclic olefin polymer), PET (polyethylene terephthalate), PI (polyimide), etc.

In the related art, it is difficult to achieve a metal mesh with a line width of being less than 2 μm and a thickness of being greater than 2 μm at the same time, because when it is to form on an insulating layer a groove with a depth of being greater than 2 μm and a width of being less than 2 μm, and form a metal line in the groove, it is difficult to expose and develop with respect to the line width of being less than 2 μm due to the limitation of the ultraviolet lithography process; and the width of the formed groove will also be greater than 2 μm due to the side etching of the etching process; in addition, if a metal line having a thickness of being greater than 2 μm and a width of being less than 2 μm is directly formed on the base, the metal line is easily collapsed.

In this embodiment, in order to obtain a groove with a depth of being greater than 2 μm and a width of being less than 2 μm (so as to obtain a metal trace with a line width of being less than 2 μm and a thickness of being greater than 2 μm), an insulating material may be etched firstly to form an initial groove (i.e. the first groove) with a depth of being greater than 2 μm and a ratio of depth to width of being less than 1, and then an insulating film layer is deposited on the insulating material. The insulating film layer covers the whole surface of the insulating material, including covering the side wall and the bottom of the first groove, so that the part of the insulating film layer covering the side wall of the first groove can help to reduce the width of the groove; in addition, since the insulating film layer covers the entire first groove, it is possible to ensure that the depth of the finally formed groove is equal to or approximately equal to the depth of the first groove, and thus it is possible to adjust the ratio of depth to width of the groove by controlling the thickness of the insulating film layer, such that the ratio of the depth to the width of the groove is greater than 1 and the depth of the groove is greater than 2 μm.

In some embodiments, forming the insulating layer includes:
  forming a first insulating sub-layer on the base, wherein a first groove is formed in a side surface of the first insulating sub-layer distal to the base;
  forming a second insulating sub-layer on a side of the first insulating sub-layer distal to the base, wherein the second insulating sub-layer covers the first groove, the groove is formed at a position corresponding to the first groove, an orthographic projection of the groove onto the base is located within an orthographic projection of the first groove onto the base.

The depth of the finally formed groove depends on the depth of the first groove, the thickness of the first insulating sub-layer is not less than the depth of the first groove, and the thickness of the second insulating sub-layer depends on the difference between the widths of the first groove and the finally formed groove. For example, the width of the first groove is D1, the width of the finally formed groove is D2, and D1−D2 =x, then the thickness d of the second insulating sub-layer may be d=x/1.2.

When the depth of the groove is more than 2 μm, the thickness of the first insulating sub-layer needs to be more than 2 μm, and the first insulating sub-layer can be made of an organic material, because when an inorganic insulating layer having a relatively large thickness is deposited on a base, a relatively large stress is generated, and the base is easily broken. When the first insulating sub-layer is made of an organic material, the first insulating sub-layer may be formed through a coating process. In some embodiments, the first insulating sub-layer may be made of the SOC adhesive.

In order to precisely control the width of the groove, the second insulating sub-layer may be formed by depositing an inorganic insulating material. In order to do not adversely affect the visual effect of the substrate, the refractive index of the second insulating sub-layer should be substantially equal to the refractive index of the first insulating sub-layer.

In some embodiments, forming the second insulating sub-layer includes:

forming a plurality of insulating film layers which are laminated.

When the second insulating sub-layer includes only one insulating film layer, the refractive index of the insulating film layer is difficult to be exactly equal to the refractive index of the first insulating sub-layer due to the limitation of the deposition process. If the refractive index of the insulating film layer is not equal to the refractive index of the first insulating sub-layer, the visual effect of the substrate will be adversely affected. Therefore, the second insulating sub-layer may include a plurality of insulating film layers, so that even if the refractive index of one insulating film layer is not equal to the refractive index of the first insulating sub-layer, the refractive indices of the insulating film layers may match each other by adjusting the refractive indices of the other insulating film layers, so that the adverse impact on the visual effect of the substrate can be reduced.

In some embodiments, forming the second insulating sub-layer includes:

forming at least one group of insulating film layers, wherein each group of insulating film layers includes a first insulating film layer and a second insulating film layer, the first insulating film layer is located between the second insulating film layer and the base, a refractive index of the first insulating film layer is less than a refractive index of the first insulating sub-layer, and a refractive index of the second insulating film layer is greater than a refractive index of the first insulating sub-layer. Thus, it is not required that the refractive index of the insulating film layer must be exactly equal to the refractive index of the first insulating sub-layer, so that the requirement for the deposition process can be reduced. Specifically, a difference between a refractive index of the insulating film layer and a refractive index of the first insulating sub-layer may be less than 0.01. Alternatively, in some embodiments, a ratio of the refractive index of the insulating film layer to the refractive index of the first insulating sub-layer may be greater than or equal to 0.98 and smaller than or equal to 1.02.

In an embodiment, as shown in FIGS. 1 to 18, a method for manufacturing a substrate includes the following steps.

At step 1, as shown in FIG. 1, a flexible base 02 is formed on a rigid base 01.

The rigid base 01 may be, for example, a quartz base or a glass base; the flexible base 02 may be made of COP (cycloolefin polymer), PET (polyethylene terephthalate), PI (polyimide), or the like. If it is not necessary to make a flexible substrate, the flexible base 02 may be removed and subsequent film layers may be formed directly on the rigid base 01.

Figure 2:
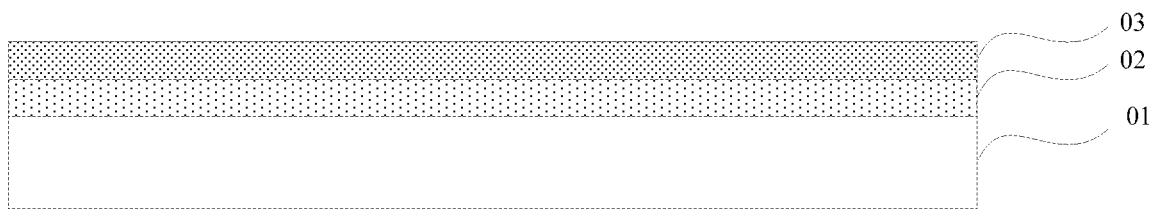

At step 2, as shown in FIG. 2, a buffer layer 03 is formed on the flexible base 02.

In particular, a SiOx layer with a thickness of 20 nm may be deposited as the buffer layer 03 through a plasma enhanced chemical vapor deposition (PECVD) process, and if the tolerance temperature of the flexible base is low, a low temperature thin film encapsulation chemical vapor deposition (TFECVD) process may be used.

Figure 3:
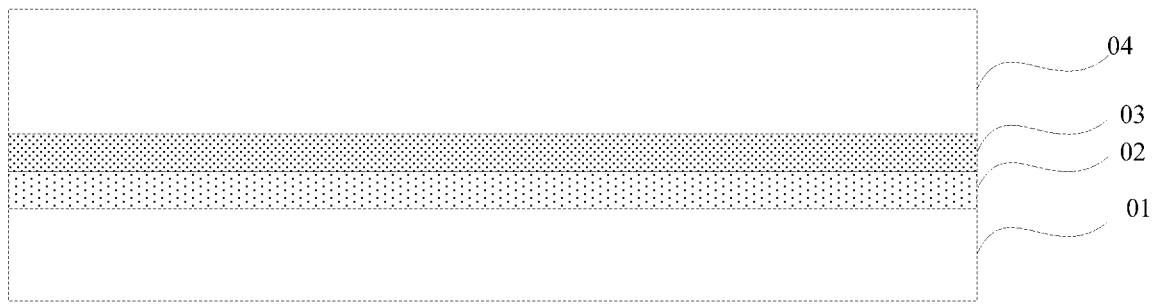

At step 3, as shown in FIG. 3, a first insulating sub-layer 04 is formed.

Specifically, the SOC adhesive with the thickness of 4-5 µm may be applied and cured to form the first insulating sub-layer 04.

Figure 4:
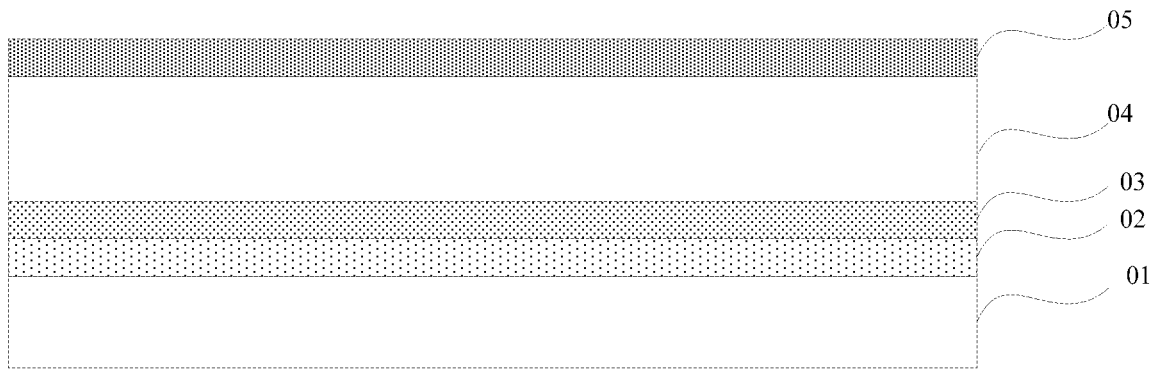

At step 4, as shown in FIG. 4, a rigid mask layer 05 is formed.

Specifically, a metal layer may be formed as the rigid mask layer 05 through a sputtering process, and the rigid mask layer 05 may be made of a metal such as Cu, Ag, Al, Mo or ITO.

Figure 5:
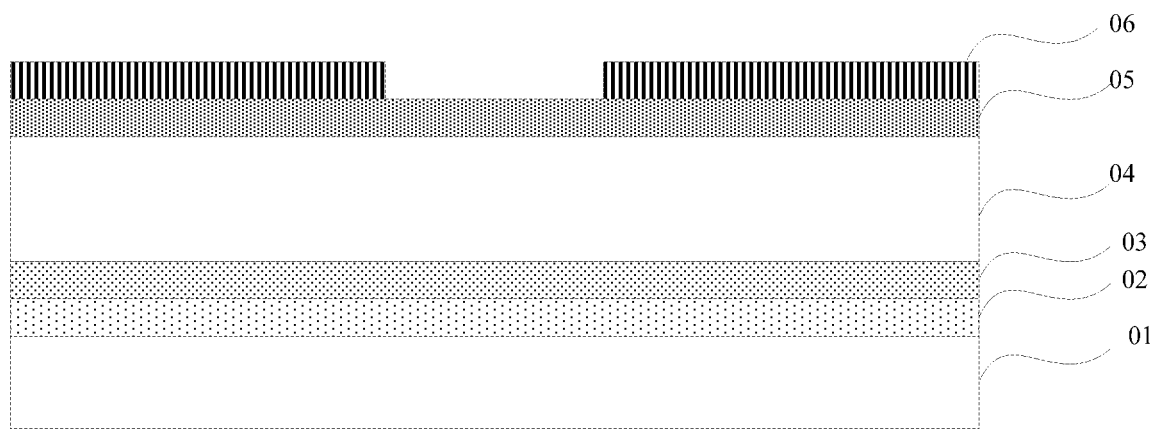

At step 5, as shown in FIG. 5, a pattern of a photoresist 06 is formed.

Specifically, a photoresist is formed on the rigid mask layer 05 through a spin coating process, and the photoresist is exposed and developed to form a pattern of the photoresist 06.

Figure 6:
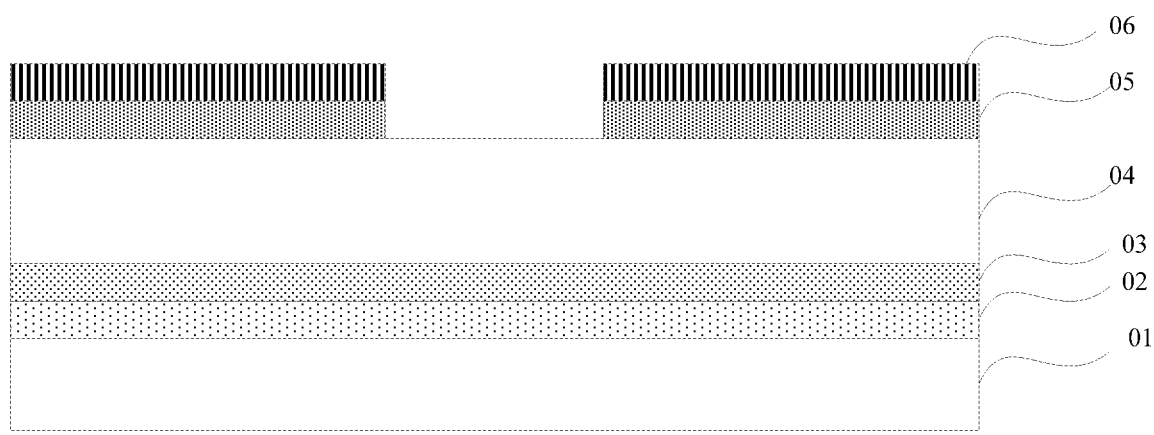

At step 6, as shown in FIG. 6, a pattern of a rigid mask layer 05 is formed.

Specifically, the rigid mask layer 05 may be formed through a wet etching process by using the pattern of the photoresist 06 as a mask to form the pattern of the rigid mask layer 05.

Figure 7:
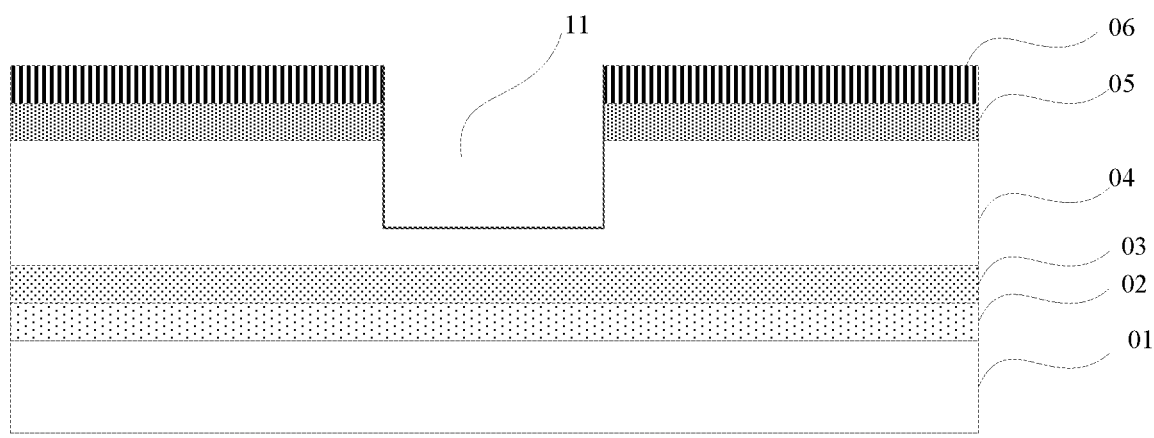

At step 7, as shown in FIG. 7, a first groove 11 is formed.

Specifically, the pattern of the rigid mask layer 05 is taken as a mask, and a RIE (reactive ion etching) or ICP (inductive coupled plasma) etching process is adopted to etch the first insulating sub-layer 04, so as to form the first groove 11, wherein the depth H1 of the first groove 11 may be about 3 µm, and the width D1 of the first groove 11 may be greater than 3 µm.

Figure 8:
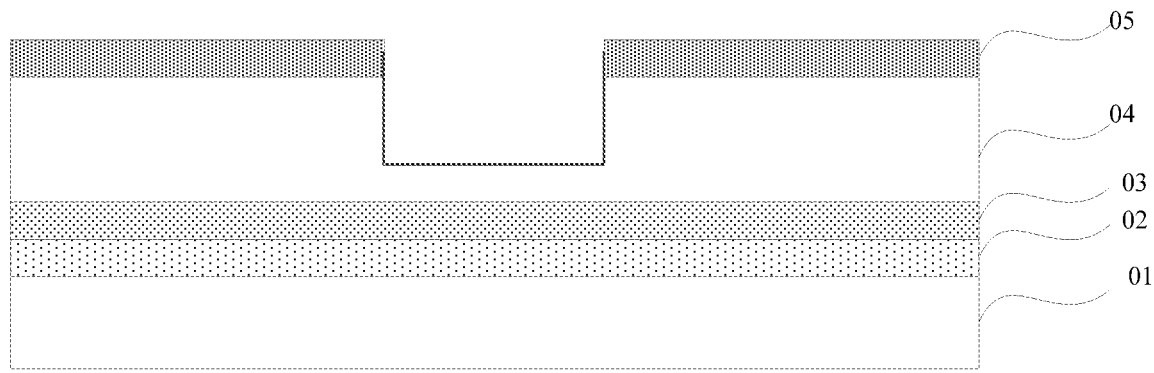

At step 8, as shown in FIG. 8, the photoresist 06 is removed.

Figure 9:
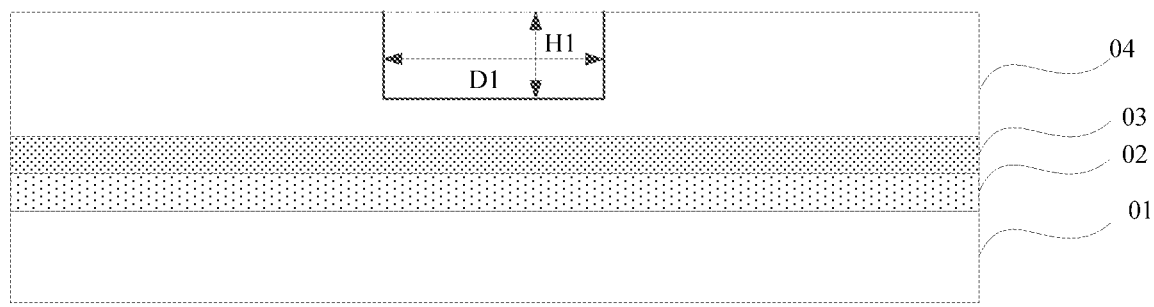

At step 9, as shown in FIG. 9, the rigid mask layer 05 is removed through a wet etching process.

Figure 10:
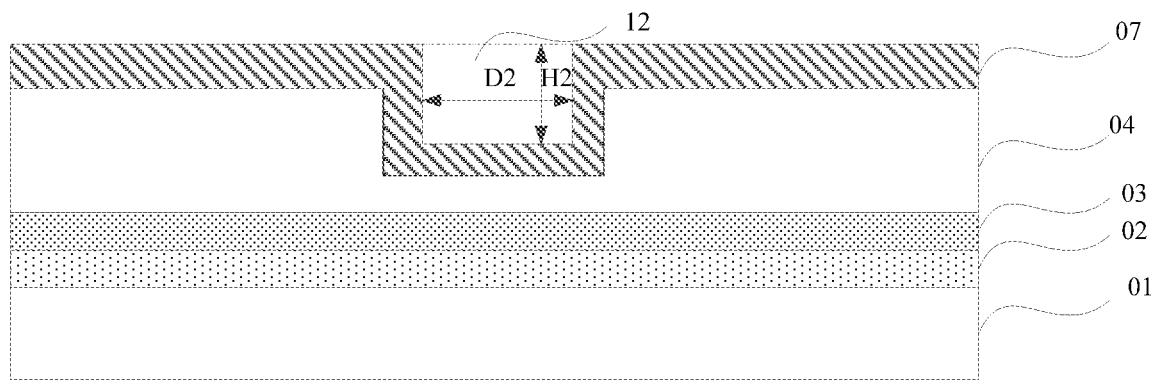

At step 10, as shown in FIG. 10, a second insulating sub-layer 07 is deposited on the substrate after step 9.

Specifically, a plasma enhanced chemical vapor deposition (PECVD) process may be used to deposit a groove that is made of SiONx and provided with a narrowed width and a specific thickness, and the thickness d of the SiONx may be determined according to the width x to be narrowed as required, with the relationship of d=x/1.2, so as to obtain a groove 12 of any width. The depth H2 of the groove 12 is substantially equal to H1, the width D2 of the groove 12 is smaller than D1, and the difference between D1 and D2 is d, specifically, D2 is smaller than 2 µm.

For example, in some embodiments, the width of the first groove 11 is 4 µm, and a groove 12 with a width of 1.6 µm needs to be obtained, then the thickness of the second insulating sub-layer 07 may be (4 µm−1.6 µm)/1.2=2 µm; in this way, a second insulating sub-layer having a thickness of 2 µm is deposited on the first groove 11, resulting in a groove 12 having a width of 1.6 µm. In another embodiment, the width of the first groove 11 is 5 µm, and a groove 12 with a width of 1.4 µm needs to be obtained, then the thickness of the second insulating sub-layer 07 may be (5 µm−1.4 µm)/1.2=3 µm; in this way, a second insulating sub-layer 07 having a thickness of 3 µm is deposited on the first groove 11, resulting in a groove 12 having a width of 1.4 µm. In the technical solution of the present embodiment, the requirements for the accuracy of the photolithography and etching processes can be reduced, a groove satisfying the requirements can be obtained, and thus a metal trace with a small line width and a large thickness can be obtained.

The refractive index of the SiONx material is preferably the same as the refractive index of the SOC adhesive, otherwise it will adversely affect the visual effect and cannot achieve complete transparency; the SiON material with a specific refractive index can be obtained by adjusting the deposition parameters, for example, the SiON material with a desired refractive index may be obtained by adjusting the gas ratio during the deposition.

Figure 11:
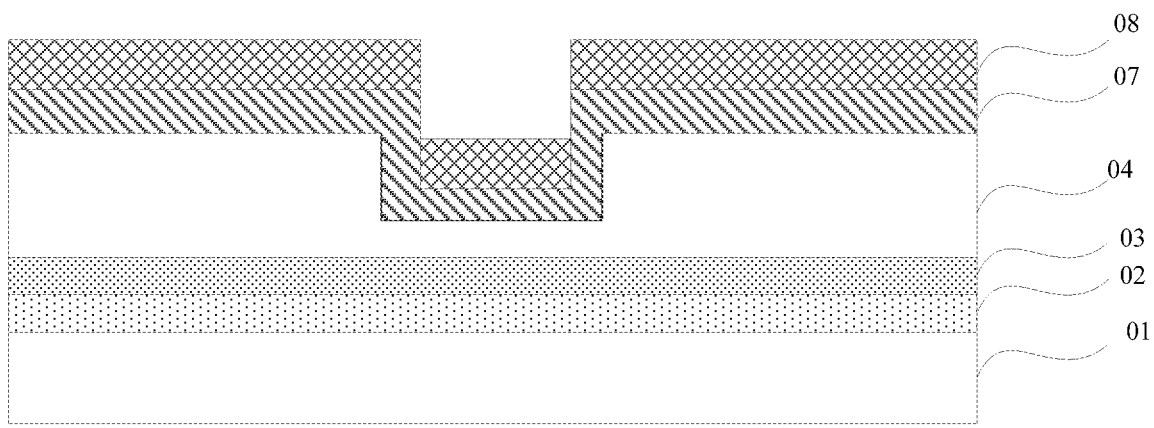

At step 11, as shown in FIG. 11, a metal layer 08 is formed.

In particular, a sputtering process may be used to deposit a metal layer 08, which may be made of Ag or Cu, since Ag and Cu have good conductivity.

Figure 12:
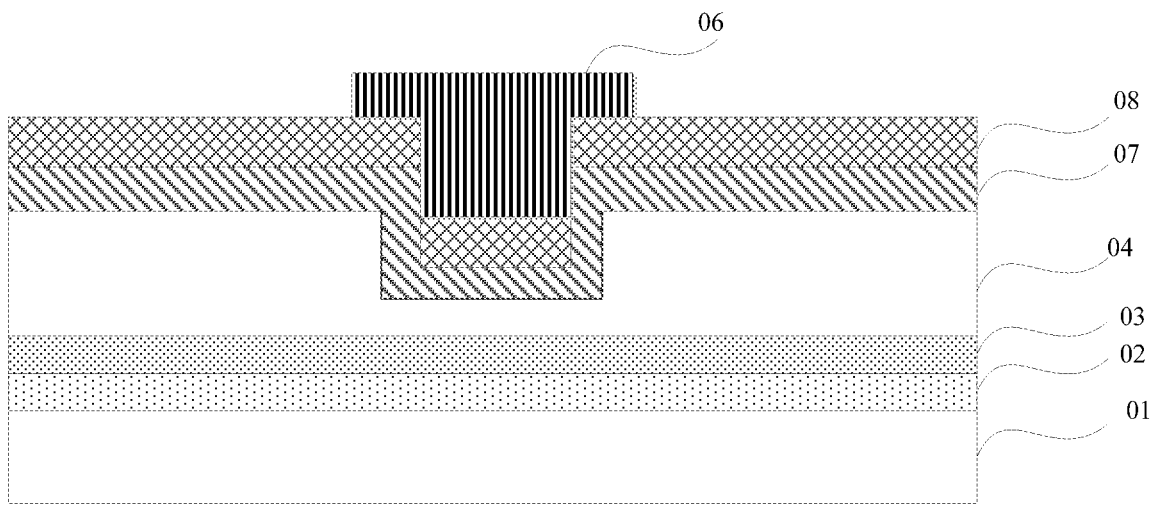

At step 12, as shown in FIG. 12, a pattern of a photoresist 06 is formed.

Specifically, a photoresist is formed on the metal layer 08 through a spin coating process, and the photoresist is exposed and developed to form a pattern of the photoresist 06, which may be larger than the groove 12 in size, so that the difficulty of photolithographic alignment can be reduced.

Figure 13:
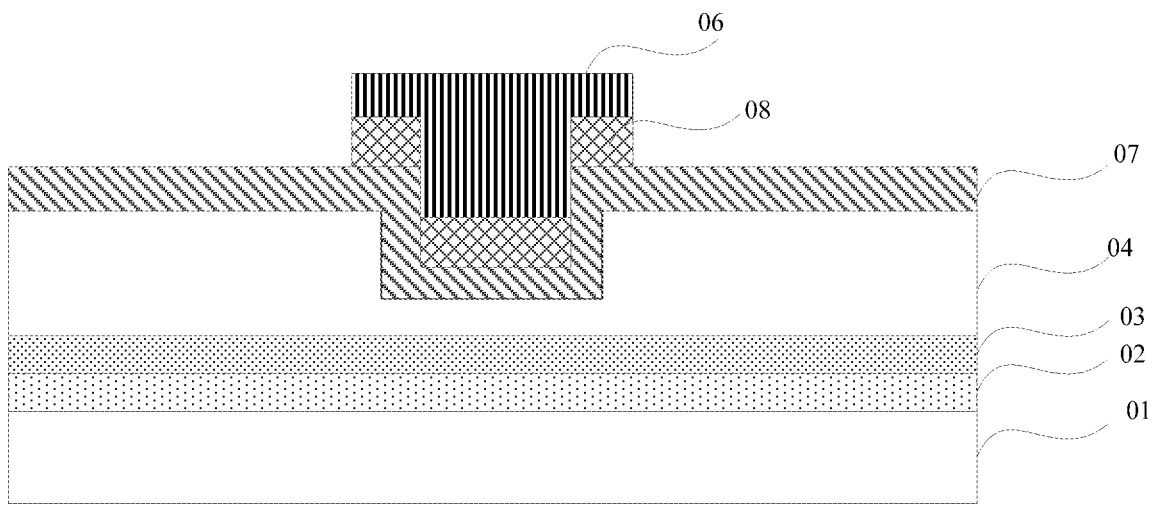

At step 13, as shown in FIG. 13, the portion of the metal layer 08 which is not protected by the photoresist 06 is removed through a wet etching process.

Figure 14:
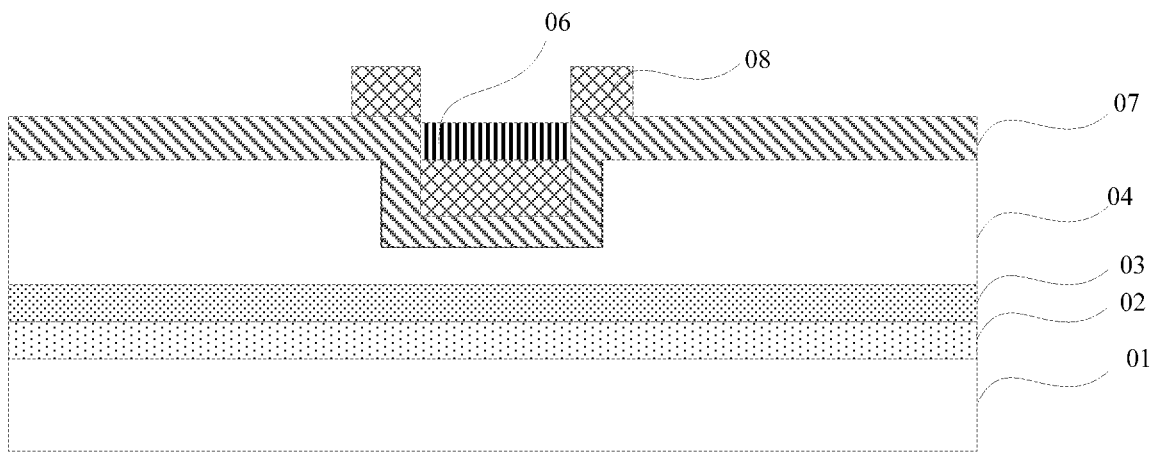

At step 14, as shown in FIG. 14, the portion of the photoresist 06 outside the groove is removed through a reactive ion etching (RIE) process with the etching time being controlled.

Figure 15:
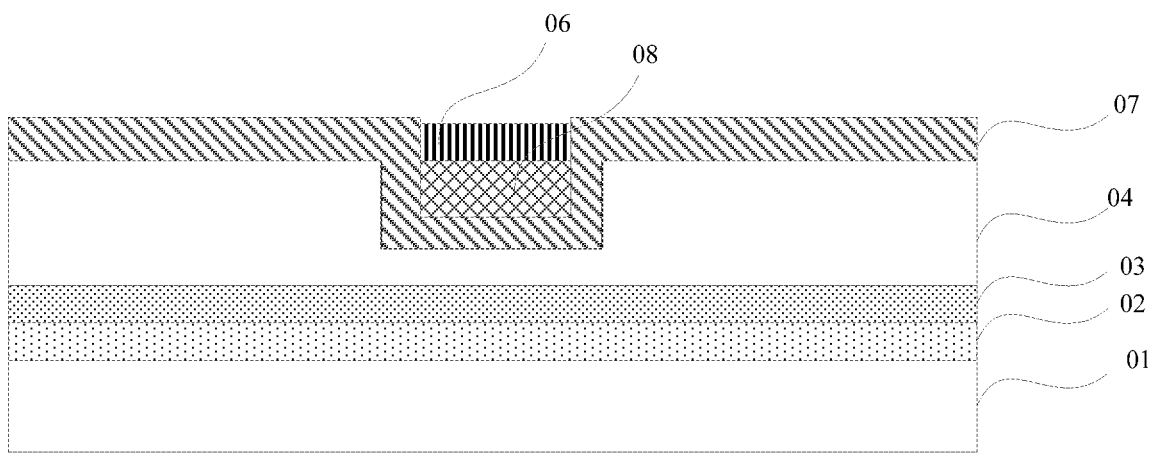

At step 15, as shown in FIG. 15, the portion of the metal layer 08 outside the groove is removed by wet etching.

Figure 16:
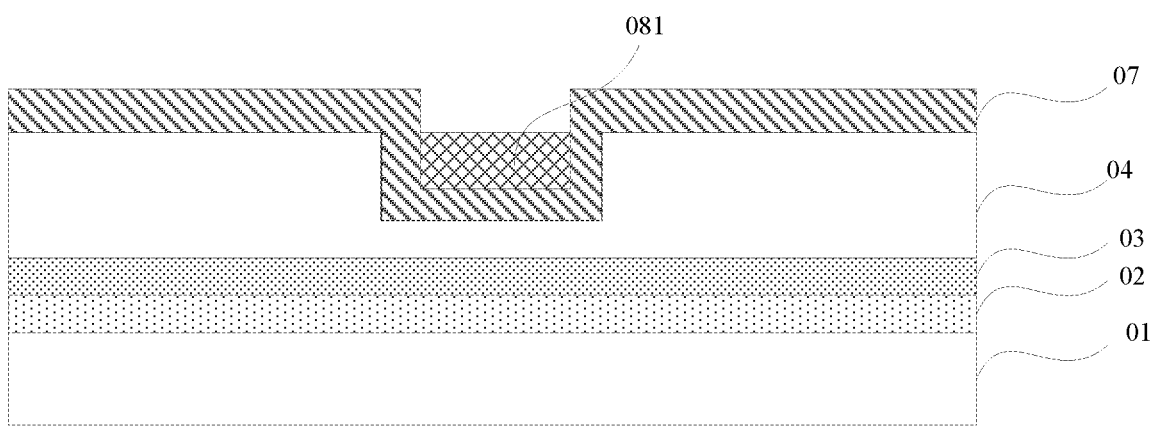

At step 16, as shown in FIG. 16, the remaining photoresist 06 is removed to form a metal seed pattern 081 in the groove.

Here, the thickness of the metal seed pattern 081 is less than the depth of the groove 12. The thickness of the metal trace that needs to be formed in this embodiment is relatively large. If a metal layer with the large thickness is subjected to a sputtering process to form the metal trace, the cost is relatively high. Therefore, the metal trace with the large thickness is formed through an electroplating process.

Figure 17:
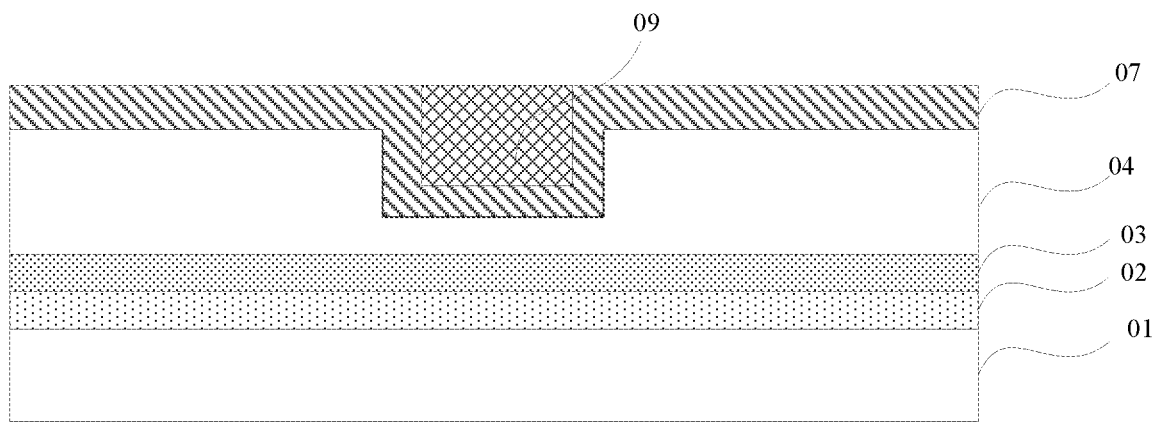

At step 17, as shown in FIG. 17, a metal plating process is used to deposit a metal on the metal seed pattern 081 to form a metal trace 09.

As a result, it may obtain a metal trace 09 with the narrow line width and the large thickness, and the thickness of the metal trace 09 is substantially equal to the depth of the groove 12.

At step 18, as shown in FIG. 18, a planarization layer 10 is formed.

Specifically, the SOC adhesive may be applied and leveled to form the planarization layer 10.

The planarization layer 10 may prevent the metal trace from being oxidized. In order to improve the transparent visual effect of the substrate, the refractive index of the planarization layer is the same as the refractive index of the first insulating sub-layer. Specifically, a material of the planarization layer may be the same as that of the first insulating sub-layer. For example, the first insulating sub-layer is made of the SOC adhesive, and the planarization layer 10 may also be made of the SOC adhesive. In addition, the first insulating sub-layer and the planarization layer may also be made of NOA series ultraviolet curing adhesive or MR-1301 adhesive.

According to the technical solution of the present embodiment, a metal trace 09 with the narrow line width and the large thickness can be formed, for example, the line width of the metal trace 09 can be as less as 1.547 µm and the thickness can be as large as 4.065 µm, and the metal mesh made by using the metal trace has a high optical transparency and can improve the transmittance of the substrate.

In an embodiment, as shown in FIG. 19, the second insulating sub-layer 07 may include two insulating film layers, i.e., a first insulating film layer 071 and a second insulating film layer 072 which are laminated, if the first insulating sub-layer 04 is made of SOC-5004U adhesive with a refractive index of 1.53 and the insulating film layer is made of SiON, the refractive index of the first insulating film layer 071 may be 1.52-1.53, the refractive index of the second insulating film layer 072 may be 1.53-1.55, and the thicknesses of the first insulating film layer 071 and the second insulating film layer 072 are the same.

Figure 20:
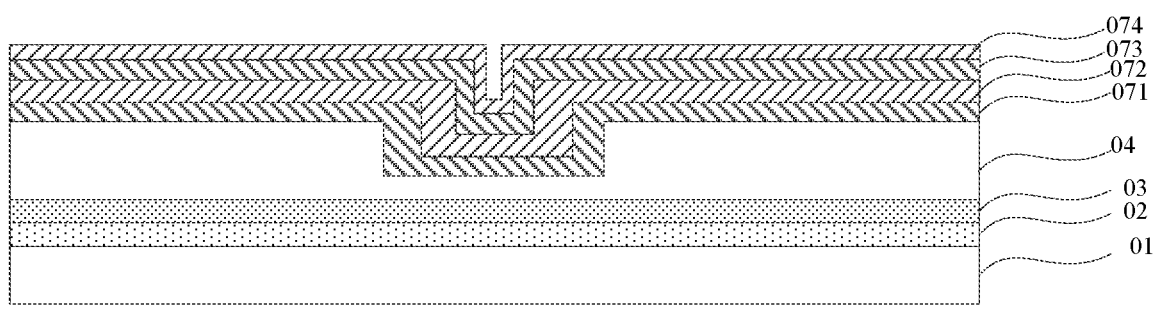

In another embodiment, as shown in FIG. 20, the second insulating sub-layer 07 may include four insulating film layers; a first insulating film layer 071, a second insulating film layer 072, a third insulating film layer 073 and a fourth insulating film layer 074 which are laminated; if the first insulating sub-layer 04 is made of SOC-5004U adhesive with a refractive index of 1.53, and the insulating film layer is made of SiON, the refractive index of the first insulating film layer 071 may be 1.51-1.53, the refractive index of the second insulating film layer 072 may be 1.53-1.56, and the refractive index of the third insulating film layer 073 may be 1.51-1.53; the refractive index of the fourth insulating film layer 074 may be 1.53-1.56, and the thicknesses of the first insulating film layer 071, the second insulating film layer 072, the third insulating film layer 073 and the fourth insulating film layer 074 are the same.

An embodiment of the present disclosure further provides a display device including the substrate as described above. The metal trace in the substrate in the present embodiment may be a touch control trace of the display device, or may also be other signal trace of the display device. When the metal trace of the present embodiment is used for the touch control trace, the thickness of the touch control trace is large, the resistance of touch control trace can be reduced, and the response speed of the touch control can be improved; in addition, the line width of the touch control trace is small, so that the adverse impaction on the operation of the display device can be reduced and the display effect of the display device can be ensured.

The display device includes, but is not limited to: a radio frequency unit, a network module, an audio output unit, an input unit, a sensor, a display unit, a user input unit, an interface unit, a memory, a processor, a power supply, etc. It will be appreciated by a person skilled in the art that the configuration of the display device described above is not intended to be limiting and that the display device may include more or fewer of the components described above, or some combinations of the components, or different arrangements of the components. In the embodiments of the present disclosure, the display device includes, but is not limited to, a display, a cell phone, a tablet, a television, a wearable electronic apparatus, a navigation display device, etc.

The display device may be any product or component with a display function, such as a television, a display, a digital photo frame, a mobile phone, or a tablet computer, and the display device further includes a flexible circuit board, a printed circuit board and a back panel.

An embodiment of the present disclosure further provides an electronic apparatus including the substrate as described above. The electronic apparatus may be an antenna, and a transparent antenna can be obtained in the technical solutions of the present embodiment.

In the various method embodiments of the present disclosure, the serial number of each step shall not be used to limit the order of each step, and a person of ordinary skill in the art may change in the order of each step without involving any inventive effort, which shall also fall within the scope of the present disclosure.

It should be noted that the various embodiments herein are described in a progressive manner with reference to the same or similar parts throughout the various embodiments, with each embodiment focusing on differences from the other embodiments. In particular, the method embodiments are described more simply because they are substantially similar to the product embodiments, and for the relevant portion of the method embodiments, it may refer to that of the product embodiments.

Unless defined otherwise, technical or scientific terms used in this disclosure shall have the ordinary meaning as understood by one of ordinary skill in the art to which this disclosure belongs. The terms "first", "second", and the like as use herein do not denote any order, quantity, or importance, but rather are used to distinguish one element from another. The terms "comprising" or "comprises", and the like, means that the presence of an element or item preceding the word covers the presence of the element or item listed after the word and equivalents thereof, but does not exclude other elements or items. The terms "connecting" or "connected" and the like are not limited to physical or mechanical connections, but may include electrical connections, whether direct or indirect. The terms "upper", "lower", "left", "right" and the like are used only to indicate relative positional relationships, which may change accordingly when the absolute position of the object being described changes.

It will be understood that when an element such as a layer, film, region or substrate is referred to as being "on" or "under" another element, it can be "directly on" or "directly under" the other element or an intervening element may be present therebetween.

In the above description, particular features, structures, materials, or characteristics may be combined in any suitable manner in any one or more embodiments or examples.

While the present disclosure has been described with reference to specific embodiments thereof, it will be understood by those skilled in the art that various changes may be made and equivalents may be substituted for elements thereof without departing from the scope of the disclosure. Accordingly, the protection scope sought herein is as set forth in the claims below.

What is claimed is:

1. A substrate, comprising:
    a base;
    an insulating layer arranged on the base, wherein a groove is arranged in a side surface of the insulating layer distal to the base, a depth of the groove is greater than 2 μm, a ratio of the depth to a width of the groove is greater than 1, the width is a dimension of a longitudinal section of the groove in a first direction, the first direction is parallel to the base; the depth is a dimension of a longitudinal section of the groove in a second direction, and the second direction is perpendicular to the base;
    a metal trace arranged within the groove, wherein a thickness of the metal trace is equal to or substantially equal to the depth of the groove;
    wherein the insulating layer comprises:
    a first insulating sub-layer, wherein a first groove is arranged in a side surface of the first insulating sub-layer distal to the base;
    a second insulating sub-layer arranged on a side of the first insulating sub-layer distal to the base, wherein the second insulating sub-layer covers the first groove, the groove is formed at a position corresponding to the first groove, an orthographic projection of the groove onto the base is located within an orthographic projection of the first groove onto the base.

2. The substrate according to claim 1, wherein the second insulating sub-layer comprises:
    a plurality of insulating film layers laminated in a direction away from the base.

3. The substrate according to claim 2, wherein the second insulating sub-layer comprises at least one group of insulating film layers, wherein each of the at least one group of insulating film layers comprises a first insulating film layer and a second insulating film layer, the first insulating film layer is arranged between the second insulating film layer and the base, a refractive index of the first insulating film layer is less than a refractive index of the first insulating sub-layer, and a refractive index of the second insulating film layer is greater than a refractive index of the first insulating sub-layer.

4. The substrate according to claim 3, wherein the at least one group of insulating film layers consists of one group of insulating film layers or two groups of insulating film layers.

5. The substrate according to claim 2, wherein a difference between a refractive index of the insulating film layer and a refractive index of the first insulating sub-layer is less than 0.01.

6. The substrate according to claim 2, wherein a ratio of the refractive index of each of the plurality of insulating film layer to the refractive index of the first insulating sub-layer is greater than or equal to 0.98 and smaller than or equal to 1.02.

7. The substrate according to claim 1, further comprising:
    a planarization layer arranged at a side of the metal trace distal to the base, wherein a refractive index of the planarization layer is same as a refractive index of the first insulating sub-layer.

8. A method for manufacturing a substrate, comprising:
    providing a base;
    forming an insulating layer on the base, and forming a groove in a side surface of the insulating layer distal to the base, wherein a depth of the groove is greater than 2 μm, a ratio of the depth to a width of the groove is greater than 1, the width is a dimension of a longitudinal section of the groove in a first direction, the first direction is parallel to the base; the depth is a dimension of a longitudinal section of the groove in a second direction, and the second direction is perpendicular to the base;
    forming a metal trace within the groove, wherein a thickness of the metal trace is equal to or substantially equal to the depth of the groove;

wherein forming the insulating layer comprises:
forming a first insulating sub-layer on the base, wherein a first groove is formed in a side surface of the first insulating sub-layer distal to the base;
forming a second insulating sub-layer on a side of the first insulating sub-layer distal to the base, wherein the second insulating sub-layer covers the first groove, the groove is formed at a position corresponding to the first groove, an orthographic projection of the groove onto the base is located within an orthographic projection of the first groove onto the base.

9. The method according to claim 8, wherein forming the second insulating sub-layer comprises:
forming a plurality of insulating film layers which are laminated.

10. The method according to claim 9, wherein forming the second insulating sub-layer comprises:
forming at least one group of insulating film layers, wherein each of the at least one group of insulating film layers comprises a first insulating film layer and a second insulating film layer, the first insulating film layer is located between the second insulating film layer and the base, a refractive index of the first insulating film layer is less than a refractive index of the first insulating sub-layer, and a refractive index of the second insulating film layer is greater than a refractive index of the first insulating sub-layer.

11. The method according to claim 9, wherein forming the metal trace within the groove comprises:
forming a metal layer on the insulating film layer in which the groove is formed, patterning the metal layer to form a metal seed pattern located within the groove, and a thickness of the metal seed pattern is than the depth of the groove;
depositing metal on the metal seed pattern through a metal plating process, to form the metal trace.

12. A display device, comprising the substrate according to claim 1.

13. An electronic apparatus, comprising the substrate according to claim 1.

14. The display device according to claim 12, wherein the second insulating sub-layer comprises:
a plurality of insulating film layers laminated in a direction away from the base.

15. The display device according to claim 14, wherein the second insulating sub-layer comprises at least one group of insulating film layers, wherein each of the at least one group of insulating film layers comprises a first insulating film layer and a second insulating film layer, the first insulating film layer is arranged between the second insulating film layer and the base, a refractive index of the first insulating film layer is less than a refractive index of the first insulating sub-layer, and a refractive index of the second insulating film layer is greater than a refractive index of the first insulating sub-layer.

16. The display device according to claim 15, wherein the at least one group of insulating film layers consists of one group of insulating film layers or two groups of insulating film layers.

17. The display device according to claim 14, wherein a difference between a refractive index of the insulating film layer and a refractive index of the first insulating sub-layer is less than 0.01.

* * * * *